(12) United States Patent
Lee et al.

(10) Patent No.: US 12,086,416 B2
(45) Date of Patent: Sep. 10, 2024

(54) MEMORY SYSTEM FOR DETERMINING READ WAIT TIME, MEMORY CONTROLLER, AND METHOD FOR OPERATING MEMORY SYSTEM

(71) Applicant: SK hynix Inc., Icheon (KR)

(72) Inventors: Seon Ju Lee, Icheon (KR); Jeong Sun Park, Icheon (KR)

(73) Assignee: SK hynix Inc., Icheon (KR)

( * ) Notice: Subject to any disclaimer, the term of this patent is extended or adjusted under 35 U.S.C. 154(b) by 15 days.

(21) Appl. No.: 18/058,183

(22) Filed: Nov. 22, 2022

(65) Prior Publication Data

US 2024/0028210 A1    Jan. 25, 2024

(30) Foreign Application Priority Data

Jul. 19, 2022    (KR) .......................... 10-2022-0088819

(51) Int. Cl.
*G06F 3/06*    (2006.01)
(52) U.S. Cl.
CPC .......... *G06F 3/0613* (2013.01); *G06F 3/0659* (2013.01); *G06F 3/0679* (2013.01)

(58) Field of Classification Search
CPC ..... G06F 3/0613; G06F 3/0659; G06F 3/0679
See application file for complete search history.

(56) References Cited

U.S. PATENT DOCUMENTS

| | | | |
|---|---|---|---|
| 2009/0016366 A1* | 1/2009 | Endo ...................... | H04L 45/00 370/401 |
| 2020/0125294 A1* | 4/2020 | Parker ................. | G06F 12/0871 |
| 2023/0376245 A1* | 11/2023 | Sassara ................ | G06F 3/0679 |

FOREIGN PATENT DOCUMENTS

| | | |
|---|---|---|
| KR | 1020100082185 A | 7/2010 |
| KR | 1020190019712 A | 2/2019 |

* cited by examiner

*Primary Examiner* — Khoa D Doan

(57) ABSTRACT

A memory system may wait to receive one or more read commands from a reference time point, and read data, requested by the one or more read commands, from the memory device in response to a determination that it is possible to simultaneously read data divided and stored, as an M number of data units, in an M number of planes among a plurality of planes in response to the one or more read commands or that a maximum read wait time has elapsed from the reference time point, M being a natural number.

14 Claims, 12 Drawing Sheets

MEMORY SYSTEM FOR DETERMINING READ WAIT TIME, MEMORY CONTROLLER, AND METHOD FOR OPERATING MEMORY SYSTEM

CROSS-REFERENCE TO RELATED APPLICATION

The present application claims priority under 35 U.S.C. § 119(a) to Korean Patent Application No. 10-2022-0088819 filed on Jul. 19, 2022, which is incorporated herein by reference in its entirety.

BACKGROUND

1. Technical Field

Various embodiments of the present disclosure generally relate to a memory system for determining a read wait time to improve sequential read performance, a memory controller, and a method for operating a memory system.

2. Related Art

A memory system includes a data storage device that stores data on the basis of a request from a host, such as a computer, a server, a smartphone, a tablet PC, or another electronic device. Examples of the memory system span from a traditional magnetic-disk-based hard disk drive (HDD) to a semiconductor-based data storage device such as a solid state drive (SSD), a universal flash storage (UFS) device, an embedded MMC (eMMC) device, or the like.

The memory system may include a memory device and a memory controller for controlling the memory device. The memory controller may receive a command from the host and execute the command or control any of read/write/erase operations on the memory device based on the command. The memory controller may execute firmware to perform a logical operation for controlling such read/write/erase operations.

The host may sequentially read data corresponding to successive logical addresses from the memory system. If the host transmits commands in a delayed manner or irregularly due to various reasons (e.g., degradation in the usability of a link and overhead in a level of a driver), the sequential read performance of the memory system may be degraded.

SUMMARY

Various embodiments of the present disclosure are directed to a memory system, a memory controller, and a method for operating a memory system, capable of improving sequential read performance.

In an embodiment, a memory system may include: i) a memory device including a plurality of planes; and ii) a memory controller configured to wait to receive one or more read commands from an outside of the memory system from a reference time point, and read data, requested by the one or more read commands, from the memory device in response to a determination that it is possible to simultaneously read data divided and stored, as an M (M is a natural number) number of data units, in an M number of planes among the plurality of planes in response to the one or more read commands or that a maximum read wait time has elapsed from the reference time point.

In an embodiment, a method of operating a memory system may include: waiting to receive one or more read commands from a reference time point; determining whether it is possible to simultaneously read data divided and stored, as M (M is a natural number) number of data units, in an M number of planes among a plurality of planes included in a memory device in response to the one or more read commands or a maximum read wait time has elapsed from the reference time point; and reading data, requested by the one or more read commands, from the memory device in response to a determination that it is possible to simultaneously read data divided and stored in the M number of planes or the maximum read wait time has elapsed from the reference time point.

In an embodiment, a memory controller may include: i) a memory interface capable of communicating with a memory device including a plurality of planes; and ii) a control circuit configured to wait for a maximally set wait time to receive one or more read commands from a reference time point, and execute a read operation corresponding to the one or more read commands for the memory device, when it is possible to read in parallel data stored in all or some of the plurality of planes in response to the one or more read commands or the wait time has elapsed from the reference time point.

According to the embodiments of the disclosed technology, it is possible to improve sequential read performance.

DETAILED DESCRIPTION

Figure 1:
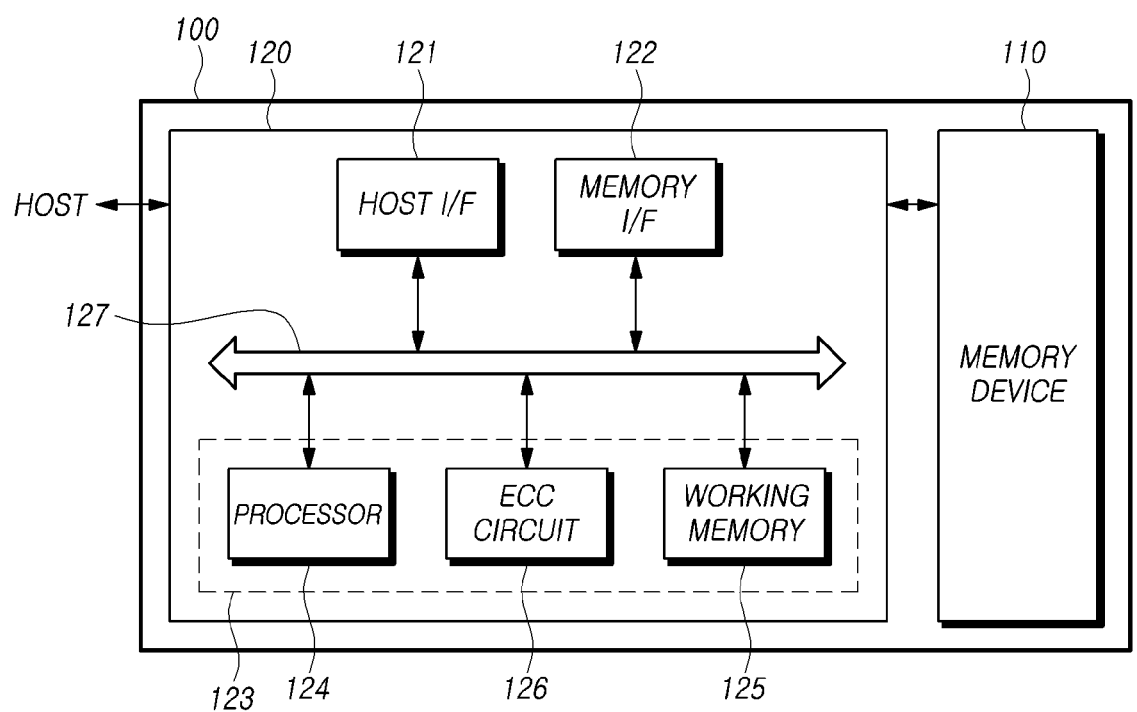
FIG. 1 illustrates a memory system according to an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers and other signal generating and signal processing features may include, for example, a memory or other storage device for storing code or instructions to be executed, for example, by a computer, processor, microprocessor, controller, or other signal processing device.

FIG. 1 illustrates a memory system 100 according to an embodiment of the disclosed technology.

The memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

Memory cells in the memory device 110 are used to store data and may be arranged in a memory cell array. The memory cell array may be divided into the multiple memory blocks and each memory block includes a plurality of pages each including memory cells. In typical implementations of NAND flash memory devices, a page of memory cells is the smallest memory unit that can be programmed or written, and data stored in the memory cells in the memory device 110 can be erased at a block level.

In some embodiments, the memory device 110 may be implemented as any of various types, such as a double data rate synchronous dynamic random access memory (DDR SDRAM), a low power double data rate4 (LPDDR4) SDRAM, a graphics double data rate (GDDR) SDRAM, a low power DDR (LPDDR) SDRAM, a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like.

The memory device 110 may be implemented in a three-dimensional array structure. Some embodiments of the disclosed technology are applicable to any type of flash memory devices having an electric charge storage layer. In an embodiment, the electric charge storage layer may be formed of a conductive material, and such an electric charge storage layer can be called a floating gate. In another embodiment, the electric charge storage layer may be formed of an insulating material, and such a flash memory device can be called a charge trap flash (CTF) memory device.

The memory device 110 may receive a command and an address from the memory controller 120 to access a memory area of the memory cell array that is selected by the address. That is, the memory device 110 may perform an operation corresponding to the command on a memory area of the memory device 110 that has a physical address corresponding to the address received from the memory controller 120.

In some embodiments, the memory device 110 may perform a program operation, a read operation, an erasure operation, and the like. During the program operation, the memory device 110 may write data in the memory area selected by the address. During the read operation, the memory device 110 may read data from the memory area selected by the address. During the erasure operation, the memory device 110 may erase data stored in the memory area selected by the address.

The memory controller 120 may control write (or program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 in response to a request from a host HOST. Alternatively, the memory controller 120 may control the operation of the memory device 110 even in absence of a request from the host HOST when it performs such background operations of the memory device 110.

The memory controller 120 and the host HOST may be separate devices. In some embodiments, the memory controller 120 and the host HOST may be integrated and implemented as a single device. In the following description, the memory controller 120 and the host HOST will be discussed as separate devices.

Referring to FIG. 1, the memory controller 120 may include a memory interface (memory I/F) 122, a control circuit 123, and a host interface (host I/F) 121.

The host interface 121 may be configured to provide an interface for communication with the host HOST.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may provide an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage memory operations to be performed on the memory system 100. The processor 124 may translate a logical block address (LBA) provided by the host HOST into a physical block address (PBA) through the FTL. The FTL may receive the LBA and translate the LBA into the PBA by using a mapping table.

There are various address mapping methods which may be employed by the FTL, according to a mapping unit. Typical address mapping methods may include a page mapping method, a block mapping method, and a hybrid mapping method.

The processor 124 may be configured to randomize data received from the host HOST to write the randomized data into the memory cell array. For example, the processor 124 may randomize the data received from the host HOST by using a randomizing seed. The randomized data is provided to the memory device 110 and written into the memory cell array.

The processor 124 may be configured to derandomize data received from the memory device 110 during a read operation. For example, the processor 124 may derandomize the data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (or drive) firmware loaded into the working memory 125 during a booting operation of the memory system 100.

The firmware refers to a program or software stored on a certain nonvolatile memory and is executed inside the memory system 100.

In some embodiments, the firmware may include various functional layers. For example, the firmware may include at least one of a flash translation layer (FTL) configured to translate a logical address in a request received from the host HOST to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) that are volatile memories.

The error detection/correction circuit 126 may be configured to detect and correct one or more erroneous bits in data by using an error detection and correction code. In some embodiments, data that is subject to the error detection and correction may include data stored in the working memory 125, and data retrieved from the memory device 110.

The error detection/correction circuit 126 may be implemented to decode data by using the error detection and correction code. The error detection/correction circuit 126 may be implemented by using various decoding schemes. For example, a decoder that performs nonsystematic code decoding or a decoder that performs systematic code decoding may be used.

In some embodiments, the error detection/correction circuit 126 may detect one or more erroneous bits on a sector basis. That is, read data may include multiple sectors. In this patent document, a sector may refer to a data unit that is smaller than a read unit (e.g., page) of a flash memory. The multiple sectors constituting the read data may be mapped based on addresses.

In some embodiments, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equal to the reference value, the error detection/correction circuit 126 may determine that the corresponding sector is correctable and the corresponding sector can be marked "pass."

The error detection/correction circuit 126 may perform error detection and correction operations successively on all read data. When a sector included in the read data is correctable, the error detection/correction circuit 126 may move on to the next sector to check as to whether an error detection and correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., addresses of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

FIG. 1 illustrates the above-mentioned constituent elements 121, 122, 124, 125, and 126 of the memory controller 120. It is noted that some of the constituent elements 121, 122, 124, 125, and 126 may be omitted, or some of the constituent elements 121, 122, 124, 125, and 126 may be integrated into a single element. In addition, in some embodiments, one or more other constituent elements may be added to the memory controller 120.

Figure 2:
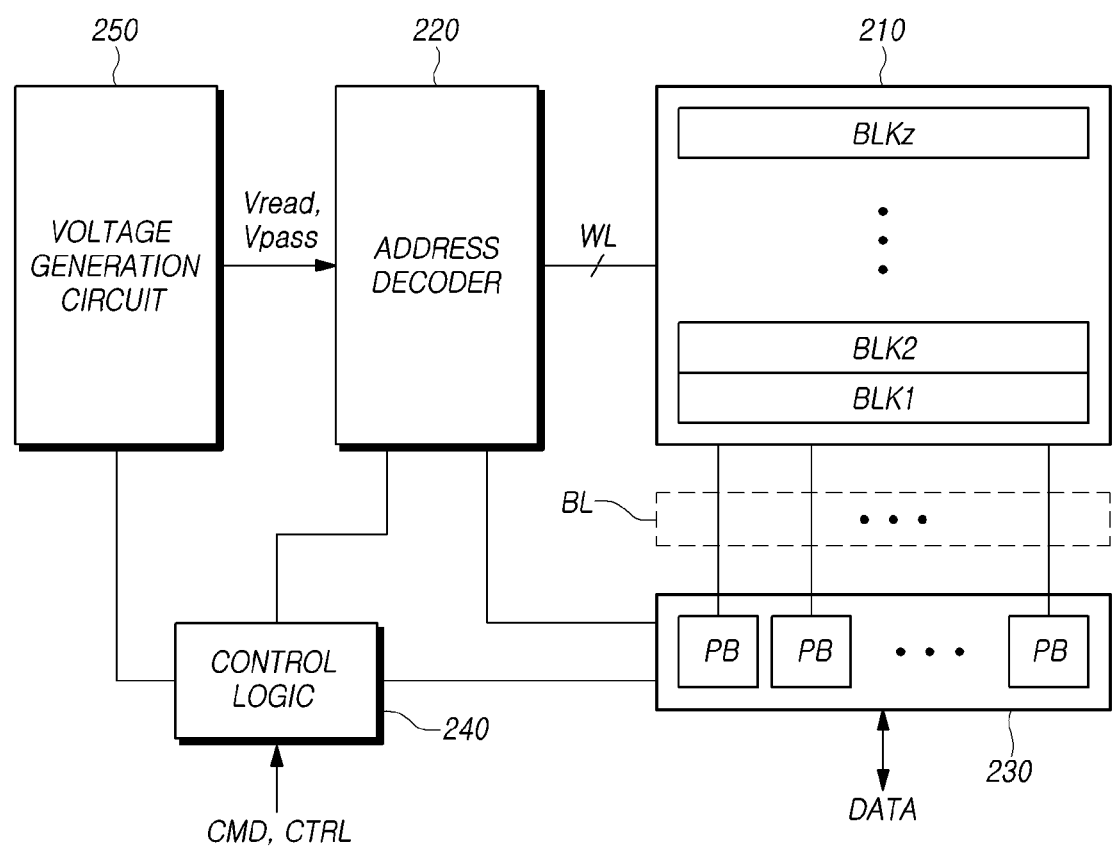
FIG. 2 illustrates a memory device according to an embodiment of the disclosed technology.

FIG. 2 illustrates a memory device 110 according to an embodiment of the disclosed technology.

The memory device 110 may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged at intersections of the multiple word lines WL and the multiple bit lines BL.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some embodiments, such nonvolatile memory cells may be arranged in a vertical channel structure.

The memory cell array 210 may be configured as a memory cell array having a two-dimensional structure. In another embodiment, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to commands and control signals of the control logic 240.

The address decoder 220 may receive addresses through an input/output buffer inside the memory device 110. The address decoder 220 may be configured to decode a block address among the received addresses. The address decoder 220 may select at least one of the multiple memory blocks BLK1-BLKz based on the decoded block address.

The address decoder 220 may receive a read voltage Vread and a pass voltage Vpass from the voltage generation circuit 250.

During a read operation, the address decoder 220 may apply the read voltage Vread to a selected word line WL that is coupled to a selected memory block and apply the pass voltage Vpass to the remaining non-selected word lines WL that are coupled to the selected memory block.

During a program verification operation, the address decoder 220 may apply a verification voltage generated by the voltage generation circuit 250 to the selected word line WL, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one of the multiple memory blocks BLK1-BLKz and one of the multiple word lines WL based on the block address and the row address, respectively. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some embodiments, may further include a cache buffer for data caching.

The multiple page buffers PB may be connected to the memory cell array 210 through the multiple bit lines BL. In order to detect or sense a threshold voltage Vth of a selected memory cell during a read operation and a program verification operation, the multiple page buffers PB may continuously supply a sensing current to bit lines BL connected to memory cells to detect, at a sensing node, a voltage change proportional to an amount of current that varies depending on a programmed state of the selected memory cell, and may hold or latch the voltage change as sensing data.

The read/write circuit 230 may operate in response to page buffer control signals output from the control logic 240.

During a read operation, the read/write circuit 230 senses a voltage change of a selected memory cell and the voltage change is read out as data. The read/write circuit 230 temporarily stores the retrieved data, and outputs it as data DATA to the input/output buffer of the memory device 110. In an embodiment, the read/write circuit 230 may include a column selection circuit in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting voltage levels of sensing nodes of the multiple page buffers PB to a pre-charge voltage level.

The control logic 240 may control the read/write circuit 230 to perform a read operation in the memory cell array 210. The voltage generation circuit 250 may generate the read voltage Vread and the pass voltage Vpass, which are used during the read operation, in response to a voltage generation circuit control signal output from the control logic 240.

A memory block BLK included in the memory device 110 may include multiple pages PG. In an embodiment, a plurality of memory cells arranged in a column form a memory cell string STR, and a plurality of memory cells arranged in a row form a page PG. Each of the multiple pages PG is coupled to a corresponding one of multiple word lines WL, and each memory cell string STR is coupled to a corresponding one of multiple bit lines BL.

In the memory block BLK, multiple word lines WL and multiple bit lines BL may be arranged in rows and columns. For example, each of the multiple word lines WL may be arranged in a row direction, and each of the multiple bit lines BL may be arranged in a column direction. As another example, each of the multiple word lines WL may be arranged in the column direction, and each of the multiple bit lines BL may be arranged in the row direction.

In some embodiments, the multiple word lines WL and the multiple bit lines BL may intersect with each other, thereby addressing a single memory cell in the memory cell array 210. In some embodiments, each memory cell MC may include a transistor TR that includes a material layer capable of holding an electrical charge.

For example, the transistor TR arranged in each memory cell MC may include a drain, a source, and a gate. The drain (or source) of the transistor TR may be connected to a corresponding bit line BL directly or via another transistor TR. The source (or drain) of the transistor TR may be connected to a source line (which may be the ground) directly or via another transistor TR. The gate of the transistor TR may include a floating gate (FG) surrounded by an insulator, and a control gate (CG) to which a gate voltage is applied from a corresponding word line WL.

In each of the multiple memory blocks BLK1-BLKz, a first selection line may be additionally arranged outside a first one of two outermost word lines, which is closer to the read/write circuit 230, and a second selection line may be arranged outside a second one of the two outermost word lines. The first selection line and the second selection line may be respectively referred to as a source selection line and a drain selection line, or the first selection line and the second selection line may be respectively referred to as the drain selection line and the source selection line.

In some embodiments, at least one dummy word line may be additionally arranged between the first outermost word line and the first selection line. In addition, at least one dummy word line may be additionally arranged between the second outermost word line and the second selection line.

A read operation and a program operation (or write operation) of the memory block may be performed page by page, and an erasure operation may be performed memory block by memory block.

Figure 3:
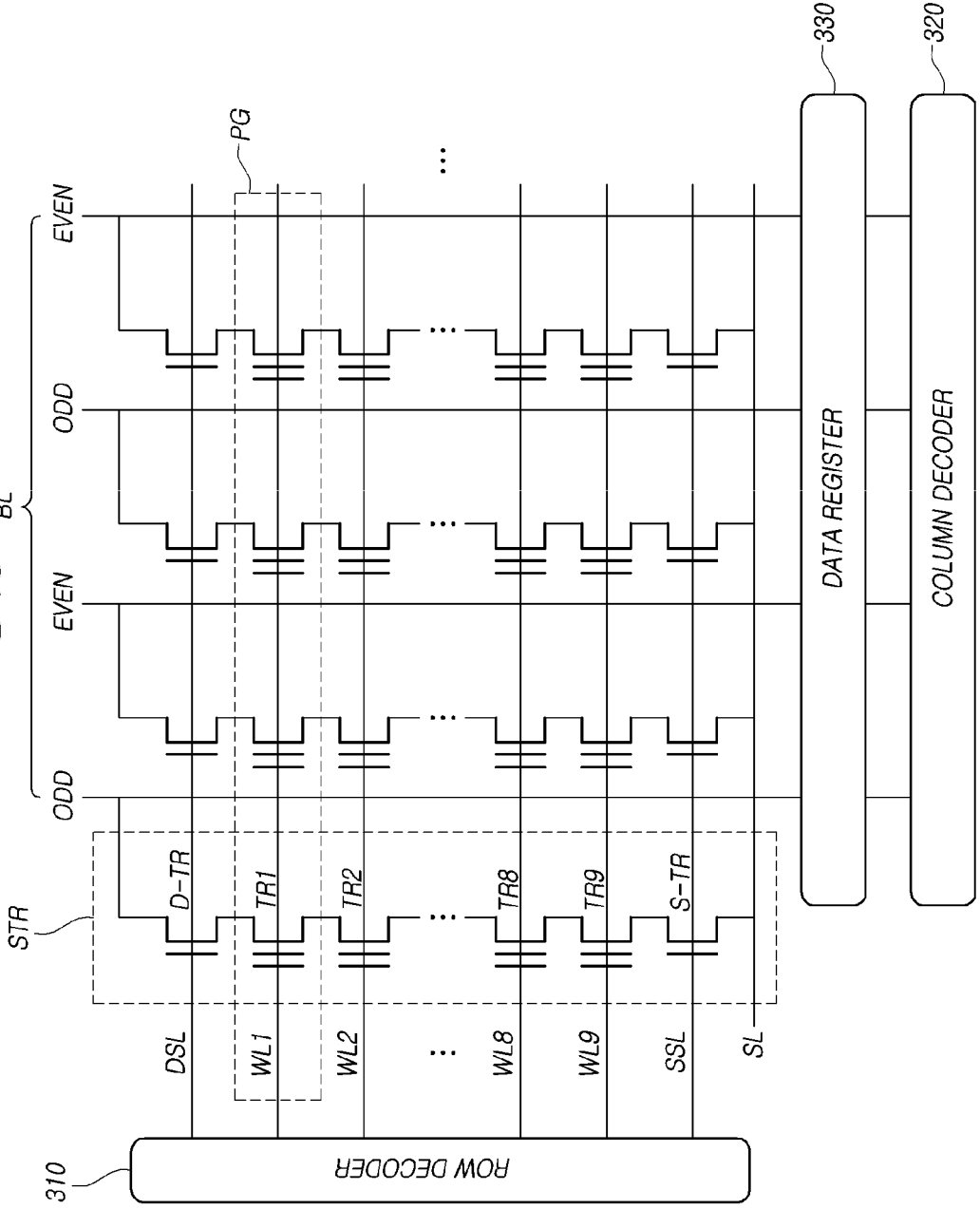
FIG. 3 illustrates a structure of word lines and bit lines of a memory device according to an embodiment of the disclosed technology.

FIG. 3 illustrates a structure of word lines WL and bit lines BL according to an embodiment of the disclosed technology. The structure shown in FIG. 3 may be included in the memory device 110 shown in each of FIGS. 1 and 2.

Referring to FIGS. 2 and 3, the memory device 110 has a core area in which memory cells MC are arranged, and an auxiliary area (the remaining area other than the core area) including circuitry that is used to perform operations of the memory cell array 210.

In the core area, a certain number of memory cells arranged in a first direction can be called a "page" PG, and a certain number of memory cells arranged in a second direction crossing the first direction can be called a "memory cell string" STR.

In FIG. 3, multiple word lines WL1-WL9 are connected to a row decoder 310. Multiple bit lines BL are connected to a column decoder 320. A data register 330, which corresponds to the read/write circuit 230 of FIG. 2, is disposed between the multiple bit lines BL and the column decoder 320.

The multiple word lines WL1-WL9 may correspond to multiple pages PG.

For example, each of the multiple word lines WL1-WL9 may correspond to one of the multiple pages PG as illustrated in FIG. 3. As another example, when each of the multiple word lines WL1-WL9 has a large size, each of the multiple word lines WL1-WL9 may correspond to at least two (e.g., two or four) pages PG. Each page PG is the smallest unit to perform a program operation and a read operation, and all memory cells MC within the same page PG may be accessed simultaneously in a program operation and a read operation.

The multiple bit lines BL may be connected to the column decoder 320. In some embodiments, the multiple bit lines BL may be divided into odd-numbered bit lines BL and even-numbered bit lines BL, such that a pair of odd-numbered bit line and even-numbered bit line is coupled in common to the column decoder 320.

The row decoder 310 and the column decoder 320 operate to select a target memory cell based on an address.

In some embodiments, the data register 330 plays an important role because data processing by the memory device 110, including program and read operations, occurs via the data register 330. If the data processing is delayed by the data register 330, all of the other constituent elements need to wait until the data register 330 finishes the data processing, which degrades the overall performance of the memory device 110.

Referring to FIG. 3, in one memory cell string STR, multiple transistors TR1-TR9 may be connected to the multiple word lines WL1-WL9, respectively. In some embodiments, the multiple transistors TR1-TR9 respectively correspond to memory cells MC. In this example, each of the multiple transistors TR1-TR9 includes a control gate (CG) and a floating gate (FG).

The multiple word lines WL1-WL9 include two outermost word lines WL1 and WL9. A first selection line DSL may be arranged outside the first outermost word line WL1, which is closer to the data register 330 and has a shorter signal path compared to the other outermost word line WL9 in the memory cell string STR. A second selection line SSL may be arranged outside the other second outermost word line WL9.

A first selection transistor D-TR, which is controlled to be turned on/off by the first selection line DSL, has a gate electrode connected to the first selection line DSL, but includes no floating gate (FG). A second selection transistor S-TR, which is controlled to be turned on/off by the second selection line SSL, has a gate electrode connected to the second selection line SSL, but includes no floating gate (FG).

The first selection transistor D-TR is used as a switch circuit that connects the memory cell string STR to the data register 330. The second selection transistor S-TR is used as a switch circuit that connects the memory cell string STR to a source line SL. That is, the first selection transistor D-TR and the second selection transistor S-TR are used to activate or deactivate the memory cell string STR.

In some embodiments, a predetermined turn-on voltage Vcc may be applied to the gate electrode of the first selection transistor D-TR, thereby turning on the first selection transistor D-TR, and a predetermined turn-off voltage (e.g., 0V)

may be applied to the gate electrode of the second selection transistor S-TR, thereby turning off the second selection transistor S-TR.

Both of the first and second selection transistors D-TR and S-TR are turned on during a read operation or a program verification operation. Accordingly, during the read operation or the program verification operation, a current may flow through the memory cell string STR to the source line SL, which corresponds to the ground, such that a voltage level of a corresponding bit line BL can be measured. However, during the read operation, there may be a time difference in on/off timing between the first selection transistor D-TR and the second selection transistor S-TR.

In an erasure operation, a predetermined voltage (e.g., +20V) may be applied to a substrate through the source line SL, and a certain voltage may be applied to both the first selection transistor D-TR and the second selection transistor S-TR in order to make the first selection transistor D-TR and the second selection transistor S-TR in a floating state. As a result, electrical charges are removed from floating gates FG of selected memory cells.

Figure 4:
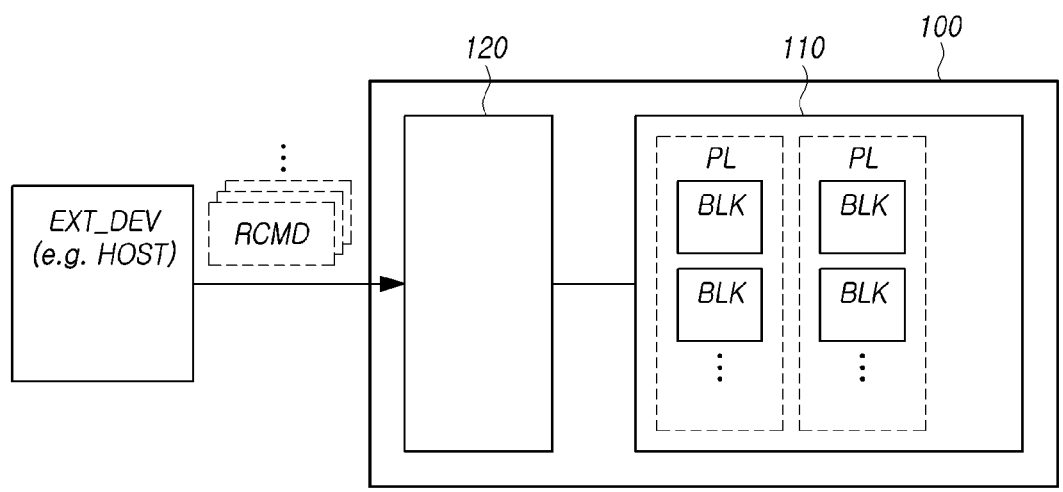
FIG. 4 illustrates a memory system according to an embodiment of the disclosed technology.

FIG. 4 illustrates a memory system 100 according to an embodiment of the disclosed technology.

Referring to FIG. 4, the memory system 100 may include a memory device 110 and a memory controller 120.

The memory device 110 may include a plurality of planes PL. Each of the plurality of planes PL may store data. Each plane PL may include a plurality of memory blocks BLK.

The plurality of planes PL may be located in one memory die (not illustrated) or in different memory dies (not illustrated) included in the memory device 110.

The memory controller 120 may wait to receive one or more read commands RCMD from the outside of the memory system 100. An external device EXT_DEV located outside the memory system 100 may transmit a command CMD to the memory controller 120. The external device EXT_DEV may be, for example, a host.

When the memory controller 120 receives the one or more read commands RCMD, the memory controller 120 may execute an operation of reading data stored in the memory device 110 on the basis of the received read commands RCMD. Hereinafter, a time point at which the memory controller 120 executes a read operation will be described.

Figure 5:
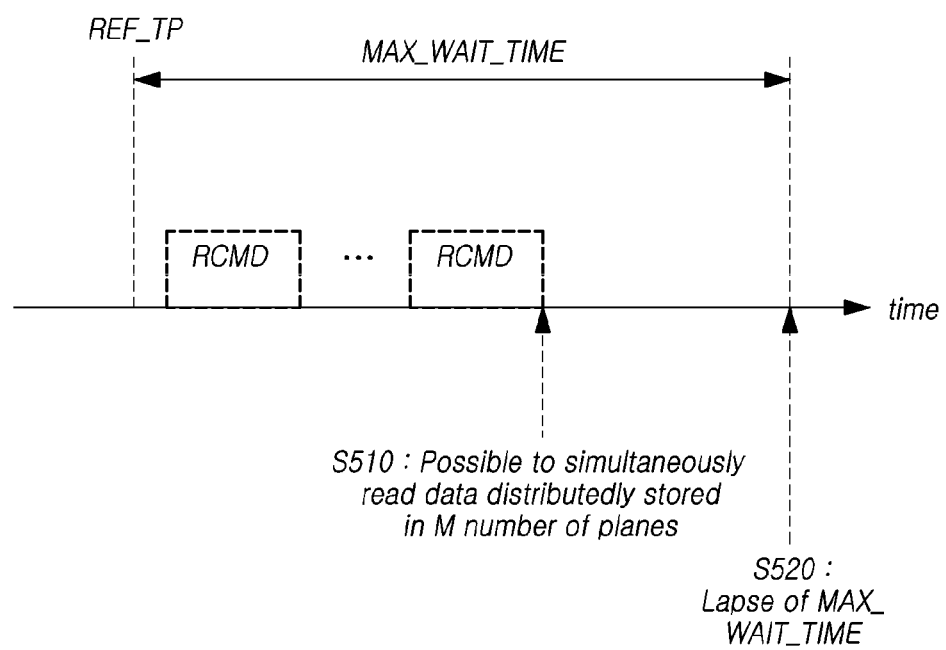
FIG. 5 illustrates time points at which a memory system executes a read operation according to an embodiment of the disclosed technology.

FIG. 5 illustrates time points at which a memory system 100 executes a read operation according to an embodiment of the disclosed technology. The memory system 100 may correspond to the memory system 100 shown in FIG. 4.

Referring to FIGS. 4 and 5, the memory controller 120 of the memory system 100 may wait to receive the one or more read commands RCMD from the outside (e.g., the host) of the memory system 100 from a reference time point REF_TP. The memory controller 120 may determine the reference time point REF_TP according to a set reference or determine the reference time point REF_TP arbitrarily. The memory controller 120 may change the reference time point REF_TP after executing the read operation.

In an embodiment, instead of immediately processing a read command RCMD when the read command RCMD is received, the memory controller 120 may delay processing the read command RCMD until a set condition is satisfied.

This is because the read performance of the memory system 100 may be improved when the memory controller 120 processes the one or more read commands RCMD in combination rather than processing the one or more read commands RCMD one by one as soon as each of the one or more read commands RCMD is received. In particular, when a plurality of read commands RCMD request successive data to be sequentially read from the memory device 110, the read performance is improved when the memory controller 120 reads at once the successive data requested by the plurality of read commands RCMD.

For example, the memory controller 120 may receive two read commands RCMD which request successive data. In this case, when the memory controller 120 receives one of the two read commands RCMD later, it is efficient to process the two read commands RCMD in combination by waiting until all of the two read commands RCMD are received and executing a read operation once, rather than processing the two read commands RCMD separately by executing a read operation twice.

A condition for the memory controller 120 to determine whether to delay an operation of processing a read command RCMD may be determined as follows.

For example, when it is possible to simultaneously read data divided and stored, as an M (M is a natural number) number of data units, in an M number of planes PL among the plurality of planes PL included in the memory device 110, the memory controller 120 may simultaneously execute read operations for the M number of data units based on read commands RCMD (S510).

A size of each of the M number of data units may be equal to a size of a page PG or a multiple of the size of the page PG. The M number of data units may be of the same size or some of them may have different sizes.

When the memory controller 120 simultaneously reads the data divided and stored in the M number of planes PL, the data stored in the M number of planes PL may be read out in parallel.

In this case, an operation of reading data stored in any one of the M number of planes PL does not delay an operation of reading data stored in the other planes of the M number of planes PL. Accordingly, the memory controller 120 may more quickly read the data stored in the M number of planes PL.

For another example, when a maximum read wait time MAX_WAIT_TIME has elapsed from the reference time point REF_TP, the memory controller 120 may execute read operations requested by read commands RCMD (S520).

This is because, when the memory controller 120 additionally waits to receive another read command RCMD so as to process one or more read commands RCMD in combination, the read performance may be rather degraded compared to when processing the one or more read commands RCMD one by one. In particular, when a read command is transmitted as being delayed or irregularly received from the outside (e.g., the host) of the memory system 100, the memory controller 120 needs to process a read command RCMD as soon as the read command RCMD is received. This is to prevent a time required to process the read command RCMD from being unnecessarily increased.

Hereinafter, the operation described above with reference to FIG. 5 will be further described with reference to FIG. 6.

Figure 6:
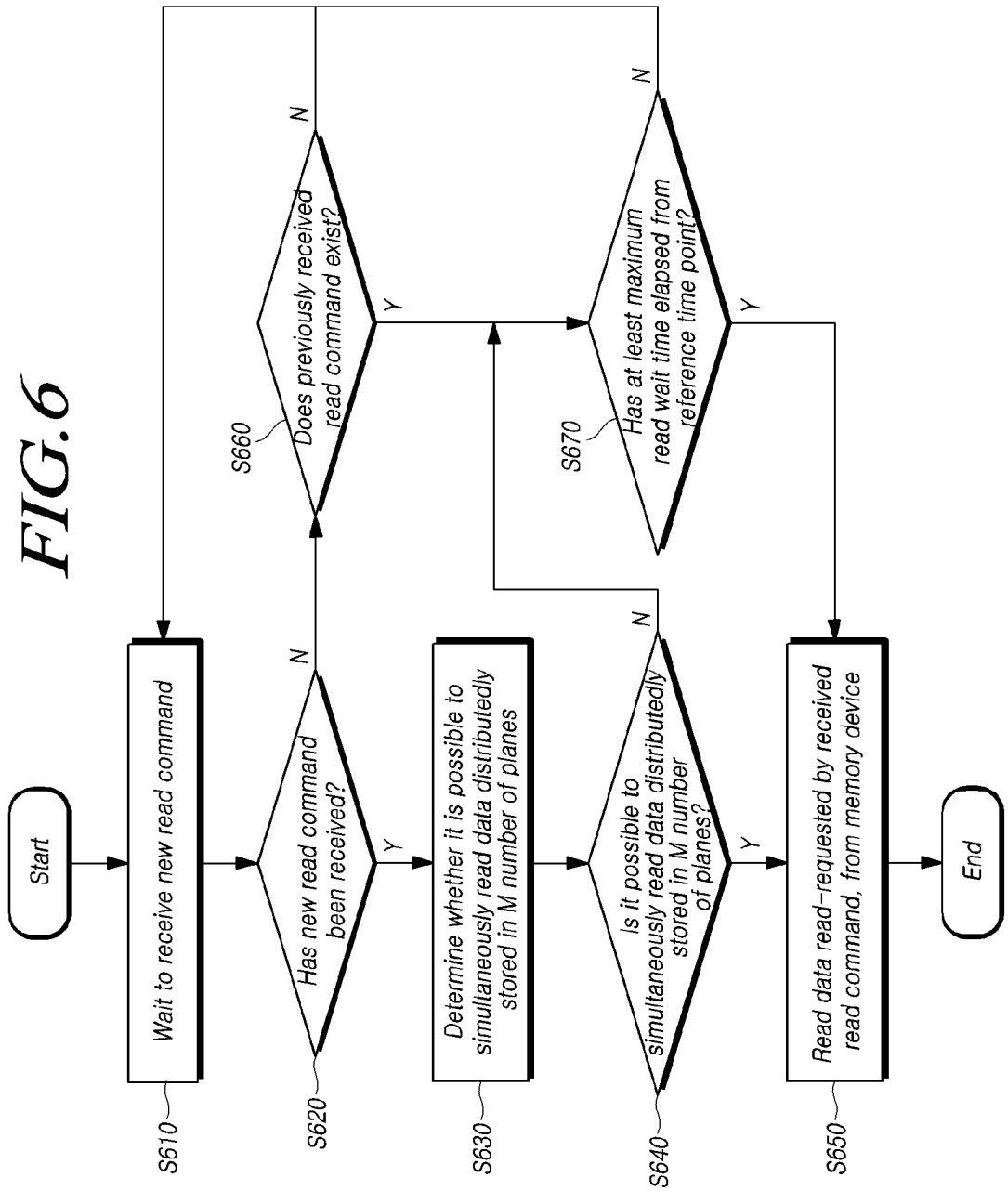
FIG. 6 is a flowchart illustrating an operation in which a memory system determines whether to execute a read operation according to an embodiment of the disclosed technology.

FIG. 6 is a flowchart illustrating an operation in which the memory system 100 of FIG. 4 determines whether to execute a read operation according to an embodiment of the disclosed technology. The operation shown in FIG. 6 will be described with reference to FIGS. 4 and 5.

Referring to FIGS. 4 and 6, the memory controller 120 of the memory system 100 may wait to receive a new read command from the outside (e.g., the host) of the memory system 100 (S610).

The memory controller 120 determines whether the new read command has been received (S620).

When it is determined that the new read command has been received (S620—Y), the memory controller 120 determines whether it is possible to simultaneously read data divided and stored, as the M number of data units, in the M number of planes PL among the plurality of planes PL included in the memory device 110 (S630). The memory controller 120 may determine whether it is possible to simultaneously read the data divided and stored in the M number of planes PL based on the new read command and at least one of previously received read commands.

When it is determined that it is possible to simultaneously read the data divided and stored in the M number of planes PL (S640—Y), the memory controller 120 may read the data, read-requested by one or more received read commands, from the memory device 110 (S650). For example, the memory controller 120 may process the new read command and at least one of the previously received read commands in combination, i.e., simultaneously process those read commands.

The data read by the memory controller 120 at step S650 may include the data divided and stored, as the M number of data units, in the M number of planes PL.

On the other hand, when it is determined that the new read command has not been received (S620—N), the memory controller 120 determines whether at least one previously received read command exists (S660).

When the previously received read command exists (S660—Y), the memory controller 120 determines whether at least the maximum read wait time MAX_WAIT_TIME has elapsed from the reference time point REF_TP (S670).

On the other hand, when the previously received read command does not exist (S660—N), the memory controller 120 may execute step S610 again.

When it is determined that it is impossible to simultaneously read data divided and stored in the M number of planes PL among the plurality of planes PL included in the memory device 110 (S640—N), the memory controller 120 determines whether the maximum read wait time MAX_WAIT_TIME has elapsed from the reference time point REF_TP (S670).

When the maximum read wait time MAX_WAIT_TIME has elapsed from the reference time point REF_TP (S670—Y), the memory controller 120 may read data, read-requested by one or more received read commands, from the memory device 110 (S650).

The data read by the memory controller 120 at step S650 may include all or some of the data divided and stored, as the M number of data units, in the M number of planes PL.

On the other hand, when the maximum read wait time MAX_WAIT_TIME has not elapsed from the reference time point REF_TP (S670—N), the memory controller 120 may execute step S610 again to receive another read command.

Hereinafter, an example of the data divided and stored, as the M number of data units, in the M number of planes PL will be described with reference to FIG. 7.

Figure 7:
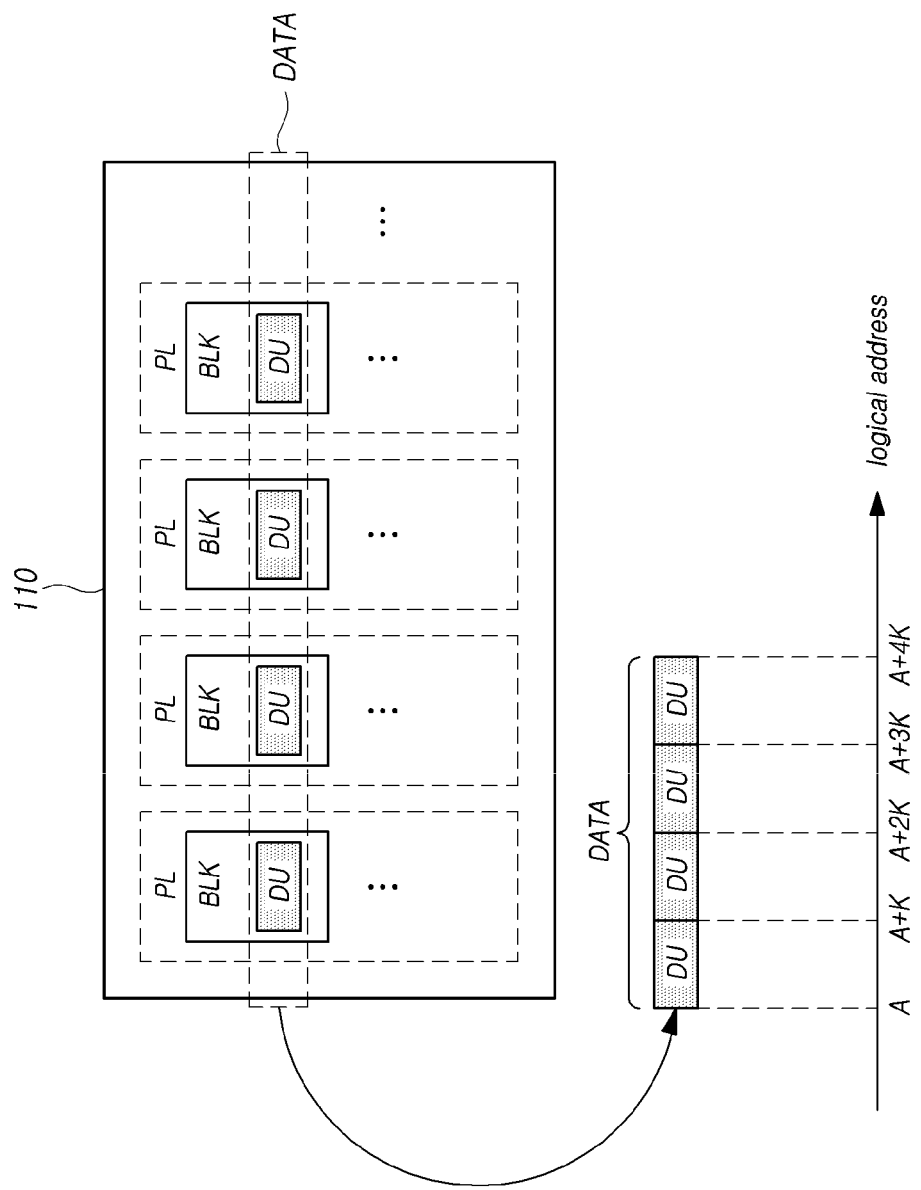
FIG. 7 illustrates an example of data divided and stored in an M number of planes according to an embodiment of the disclosed technology.

FIG. 7 illustrates an example of the data divided and stored in the M number of planes PL according to an embodiment of the disclosed technology.

Referring to FIG. 7, one data unit DU is stored in each of a plurality of planes PL included in a memory device, e.g., the memory device 110 of FIG. 4. Each data unit DU may be stored in a memory block BLK which is included in each plane PL.

Each data unit DU is a part of entire data DATA. That is to say, the entire data DATA is divided and stored in the M number of planes PL.

Data units DU may be of the same size. For example, when a size of the entire data DATA is 64 KB and the entire data DATA is equally divided into four data units DU, a size of the data unit DU may be 16 KB.

The entire data DATA may correspond to continuous logical addresses. In other words, periods of the continuous logical addresses corresponding to the entire data DATA may be expressed as one undivided period, e.g., a logical address period.

In FIG. 7, the entire data DATA is divided into the four data units DU, and the size of each data unit DU is K (e.g., 16 KB). When a starting address of one of the four data units DU corresponds to a logical address A, starting addresses of the other data units DU respectively correspond to logical addresses A+K, A+2K and A+3K, respectively. An ending address of the fourth data unit DU corresponds to a logical address A+4K. Therefore, the entire data DATA may correspond to a logical address period [A, A+4K].

In an embodiment, an operation of determining whether the data units DU constituting the entire data DATA are successive may be performed by a host interface, e.g., the host interface 121 of the memory controller 120 shown in FIG. 1.

The memory system 100 of FIG. 4 may redetermine the reference time point REF_TP and the maximum read wait time MAX_WAIT_TIME after reading data, read-requested by one or more received read commands, from the memory device 110. Hereinafter, this will be described in detail.

Figure 8:
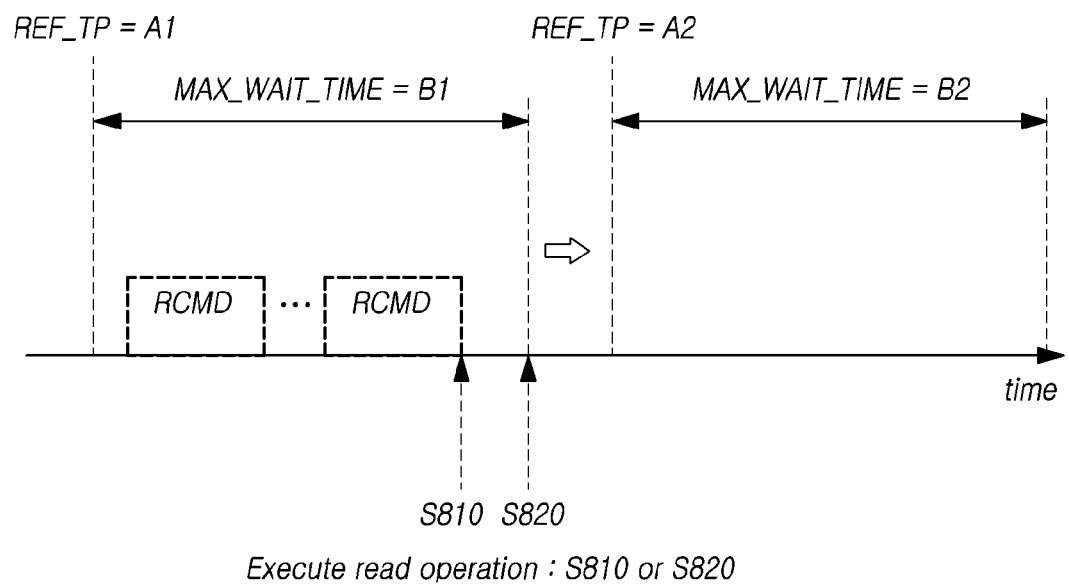
FIG. 8 illustrates an operation in which a memory system redetermines a reference time point and a maximum read wait time according to an embodiment of the disclosed technology.

FIG. 8 illustrates an operation in which the memory system 100 redetermines the reference time point REF_TP and the maximum read wait time MAX_WAIT_TIME according to an embodiment of the disclosed technology.

Referring to FIG. 8, the memory controller 120 of the memory system 100 may wait for the lapse of a maximum read wait time MAX_WAIT_TIME B1 from a reference time point REF_TP A1 to receive a plurality of read commands RCMD, and then, may read data read-requested by the plurality of read commands RCMD. The memory controller 120 may execute read operations corresponding to the plurality of read commands RCMD before the lapse of the maximum read wait time MAX_WAIT_TIME B1 (S810), or may execute the read operations after the maximum read wait time MAX_WAIT_TIME B1 has elapsed from the reference time point REF_TP A1 (S820).

Thereafter, the memory controller 120 may change the reference time point REF_TP A1 to a reference time point REF_TP A2 and change the maximum read wait time MAX_WAIT_TIME B1 to a maximum read wait time MAX_WAIT_TIME B2.

The memory controller 120 may set the reference time point REF_TP A2 at an arbitrary time point after the read operations have been executed, i.e., after a time point corresponding to S810 or S820. For example, as shown in FIG. 8, the reference time point REF_TP A2 may be set after the maximum read wait time MAX_WAIT_TIME B1 has elapsed from the reference time point REF_TP A1.

The memory controller 120 may redetermine the maximum read wait time MAX_WAIT_TIME according to a preset reference. Hereinafter, this will be described in detail with reference to FIG. 9.

Figure 9:
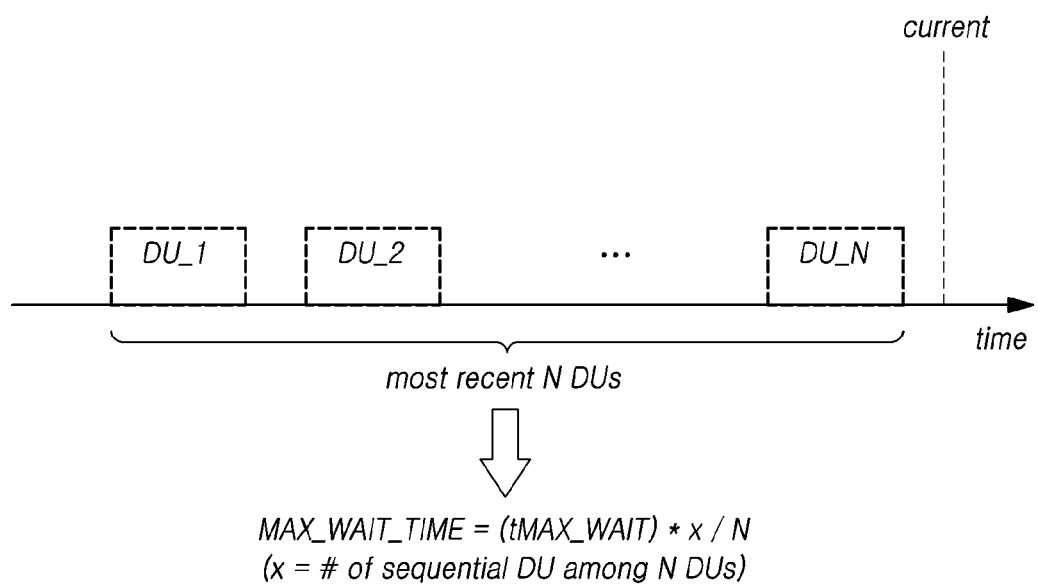
FIG. 9 illustrates an operation in which a memory system redetermines a maximum read wait time according to an embodiment of the disclosed technology.

FIG. 9 illustrates an example in which the memory system 100 redetermines the maximum read wait time MAX_WAIT_TIME according to an embodiment of the disclosed technology.

Referring to FIG. 9, the memory controller 120 of the memory system 100 may redetermine the maximum read wait time MAX_WAIT_TIME in proportion to a rate of sequential data units among an N number of data units DU_1, DU_2, ..., DU_N which are most recently read from a current time point, N being natural numbers.

For example, the sequential data units may correspond to logical addresses that are successive to each other as described above with reference to FIG. 7.

For example, when there are the x number of sequential data units among the N number of data units DU_1, DU_2, ..., DU_N, the maximum read wait time MAX_WAIT_TIME may be determined by Equation 1 as follows.

$$(\text{MAX\_WAIT\_TIME}) = (t\text{MAX\_WAIT}) * (x)/(N), \quad \text{[Equation 1]}$$

where tMAX_WAIT is a maximum read wait time to achieve targeted read performance. A value of tMAX_WAIT may be determined by experiments or may be determined as an arbitrary value.

Figure 10:
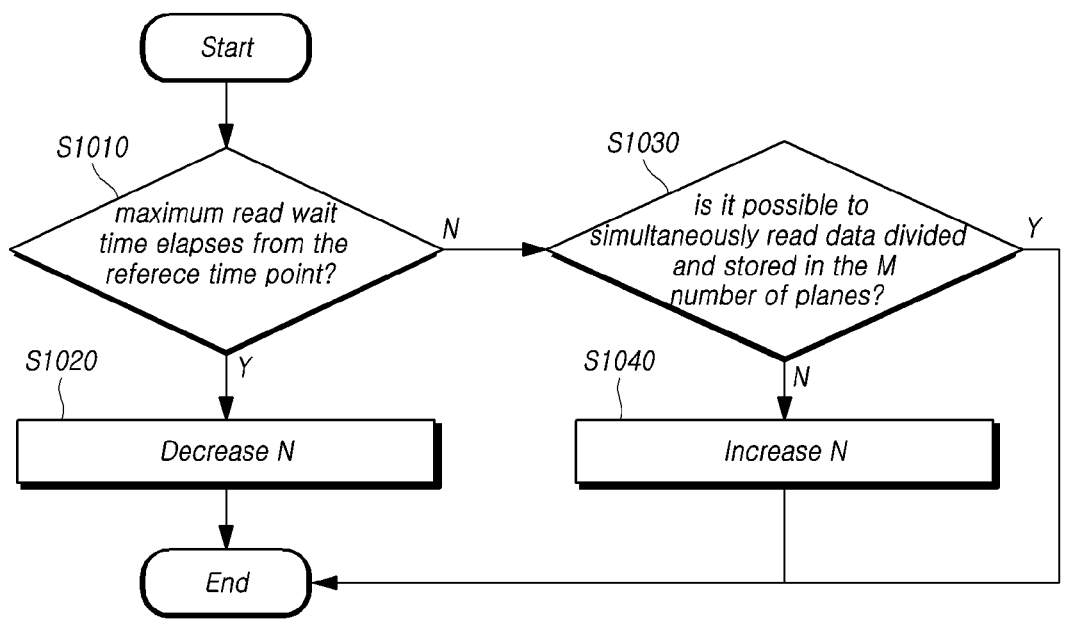
FIG. 10 is a flowchart illustrating an operation in which a memory system redetermines a maximum read wait time according to an embodiment of the disclosed technology.

FIG. 10 is a flowchart illustrating an operation in which the memory system 100 redetermines the maximum read wait time MAX_WAIT_TIME according to an embodiment of the disclosed technology.

Referring to FIG. 10, the memory controller 120 of the memory system 100 determines whether data read-requested by one or more read commands has been read from the memory device 110 when the maximum read wait time MAX_WAIT_TIME elapses from the reference time point REF_TP (S1010).

When the memory controller 120 has read the data from the memory device 110 (S1010—Y), the memory controller 120 may decrease a value of N in Equation 1 (S1020). When the value of N is decreased, the maximum read wait time MAX_WAIT_TIME may be increased according to Equation 1 described above.

On the other hand, when the memory controller 120 has not read the data from the memory device 110 (S1010—N), the memory controller 120 determines whether it is possible to simultaneously read data divided and stored in the M number of planes PL (S1030).

When it is impossible for the memory controller 120 to simultaneously read the data divided and stored in the M number of planes PL (S1030—N), the memory controller 120 may increase the value of N (S1040). When the value of N is increased, the maximum read wait time MAX_WAIT_TIME may be decreased according to Equation 1 described above.

On the other hand, when it is possible for the memory controller 120 to simultaneously read the data divided and stored in the M number of planes PL (S1030—Y), the memory controller 120 does not execute an operation of increasing or decreasing the value of N.

Figure 11:
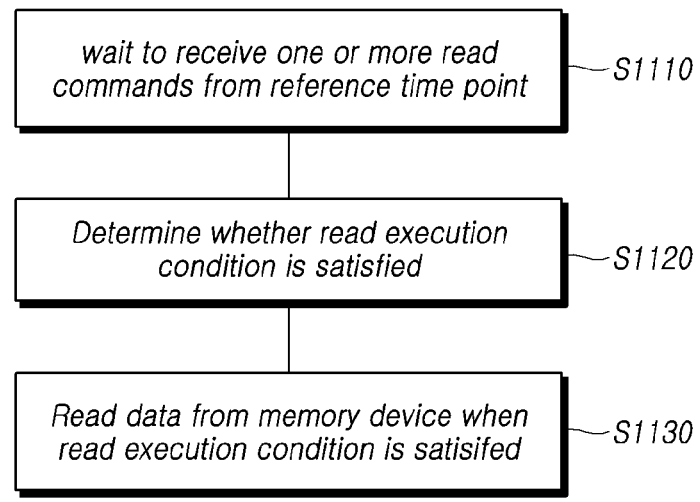
FIG. 11 illustrates a method of operating a memory system according to an embodiment of the disclosed technology.

FIG. 11 illustrates a method of operating a memory system according to an embodiment of the disclosed technology.

Referring to FIG. 11, the operating method may include waiting to receive one or more read commands from a reference time point REF_TP (S1110).

The operating method may include determining whether a set read execution condition is satisfied (S1120).

The operating method may include, when the read execution condition is satisfied, reading data, read-requested by the one or more read commands, from a memory device (S1130).

The read execution condition may be satisfied i) when it is possible to simultaneously read data divided and stored, as an M (M is a natural number) number of data units, in an M number of planes PL among a plurality of planes PL included in the memory device in response to the one or more read commands or ii) when a maximum read wait time MAX_WAIT_TIME has elapsed from the reference time point REF_TP.

The data divided and stored in the M number of planes PL may correspond to a period of continuous logical addresses.

The operating method may further include redetermining the reference time point REF_TP and the maximum read wait time MAX_WAIT_TIME.

For example, redetermining the reference time point REF_TP and the maximum read wait time MAX_WAIT_TIME may include determining a rate of sequential data units among an N number of data units which are most recently read and redetermining the maximum read wait time MAX_WAIT_TIME in proportion to the determined rate.

For example, redetermining the reference time point REF_TP and the maximum read wait time MAX_WAIT_TIME may include decreasing a value of N when a first condition is satisfied. The first condition is satisfied when the data divided and stored in the M number of planes PL has been read in response to the one or more read commands before the maximum read wait time MAX_WAIT_TIME elapses from the reference time point REF_TP.

For example, redetermining the reference time point REF_TP and the maximum read wait time MAX_WAIT_TIME may include increasing the value of N when a second condition is satisfied. The second condition is satisfied when it is impossible to simultaneously read the data divided and stored in the M number of planes PL in response to the one or more read commands until the maximum read wait time MAX_WAIT_TIME elapses from the reference time point REF_TP.

The operating method described above with reference to FIG. 11 may be executed by the memory system 100 shown in FIG. 4.

Figure 12:
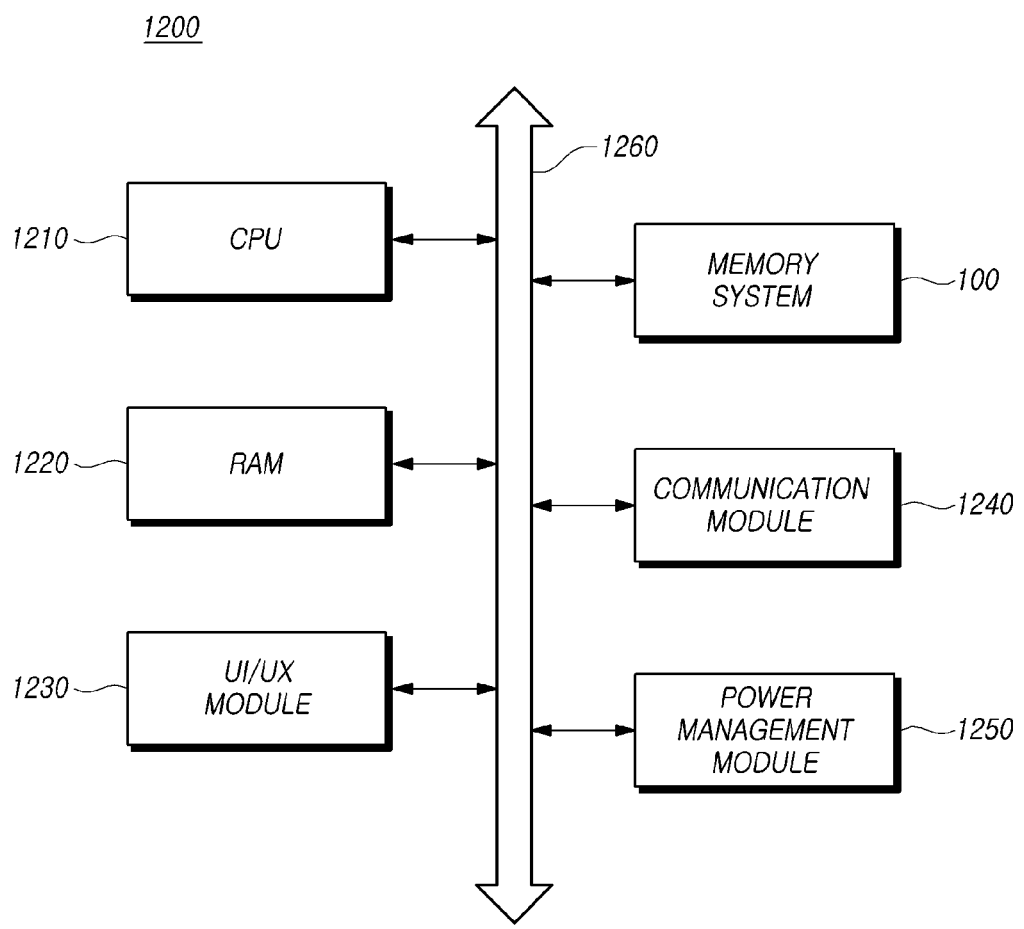
FIG. 12 illustrates a computing system according to an embodiment of the disclosed technology.

FIG. 12 illustrates a computing system 1200 according to an embodiment of the disclosed technology.

Referring to FIG. 12, the computing system 1200 may include: a memory system 100 electrically connected to a system bus 1260; a CPU 1210 configured to control the overall operation of the computing system 1200; a RAM 1220 configured to store data and information related to operations of the computing system 1200; a user interface/user experience (UI/UX) module 1230 configured to provide the user with a user environment; a communication module 1240 configured to communicate with an external device as a wired and/or wireless type; and a power management module 1250 configured to manage power used by the computing system 1200.

The computing system 1200 may be a personal computer (PC) or may include a mobile terminal such as a smartphone, a tablet or various electronic devices.

The computing system 1200 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

In accordance with the embodiments of the disclosed technology described above, the operation delay time of the memory system may be advantageously reduced or minimized. In addition, an overhead occurring in a process of calling a specific function may be advantageously reduced or minimized.

Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims.

What is claimed is:

1. A memory system comprising:
a memory device including a plurality of planes; and
a memory controller configured to wait to receive one or more read commands from a reference time point, and read data, requested by the one or more read commands, from the memory device in response to a determination that it is possible to simultaneously read data divided and stored, as an M number of data units, in an M number of planes among the plurality of planes in response to the one or more read commands, M being a natural number.

2. The memory system according to claim 1, wherein the data divided and stored in the M number of planes corresponds to a period of continuous logical addresses.

3. The memory system according to claim 1, wherein the memory controller is further configured to redetermine the reference time point and a maximum read wait time after reading the data from the memory device.

4. The memory system according to claim 3, wherein the memory controller redetermines the maximum read wait time in proportion to a rate of sequential data units among an N number of data units which are most recently read, N being a natural number.

5. The memory system according to claim 4, wherein logical addresses corresponding to the sequential data units are successive to each other.

6. The memory system according to claim 4, wherein the memory controller decreases a value of N in response to a determination that the data divided and stored in the M number of planes has been read in response to the one or more read commands before the maximum read wait time elapses.

7. The memory system according to claim 6, wherein the memory controller increases the value of N in response to a determination that it is impossible to simultaneously read the data divided and stored in the M number of planes in response to the one or more read commands until the maximum read wait time elapses.

8. A method of operating a memory system, comprising:
waiting to receive one or more read commands from a reference time point;
determining whether it is possible to simultaneously read data divided and stored, as an M number of data units, in an M number of planes among a plurality of planes included in a memory device in response to the one or more read commands, M being a natural number; and
reading data, requested by the one or more read commands, from the memory device in response to a determination that it is possible to simultaneously read data divided and stored in the M number of planes.

9. The method according to claim 8, wherein the data divided and stored in the M number of planes corresponds to a period of continuous logical addresses.

10. The method according to claim 8, further comprising:
redetermining the reference time point and a maximum read wait time.

11. The method according to claim 10, wherein the redetermining comprises:
determining a rate of sequential data units among an N (number of data units which are most recently read, N being a natural number; and
redetermining the maximum read wait time in proportion to the rate.

12. The method according to claim 11, wherein the redetermining comprises:
decreasing a value of N when the data divided and stored in the M number of planes has been read in response to the one or more read commands before the maximum read wait time elapses.

13. The method according to claim 12, wherein the redetermining comprises:
increasing the value of N when it is impossible to simultaneously read data divided and stored in the M number of planes in response to the one or more read commands until the maximum read wait time elapses.

14. A memory controller comprising:
a memory interface capable of communicating with a memory device including a plurality of planes; and
a control circuit configured to wait for a maximally set wait time to receive one or more read commands from a reference time point, and execute a read operation corresponding to the one or more read commands for the memory device, when it is possible to read, in parallel, data stored in all or some of the plurality of planes in response to the one or more read commands.

* * * * *